(12) United States Patent
Dünkel et al.

(10) Patent No.: US 10,727,251 B2
(45) Date of Patent: Jul. 28, 2020

(54) ROUNDED SHAPED TRANSISTORS FOR MEMORY DEVICES

(71) Applicant: GLOBALFOUNDRIES INC., Grand Cayman (KY)

(72) Inventors: Stefan Dünkel, Dresden (DE); Johannes Müller, Dresden (DE); Lars Müller-Meskamp, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/207,730

(22) Filed: Dec. 3, 2018

(65) Prior Publication Data

US 2020/0176456 A1 Jun. 4, 2020

(51) Int. Cl.
| | |
|---|---|
| *G11C 11/22* | (2006.01) |
| *G11C 5/12* | (2006.01) |
| *H01L 21/28* | (2006.01) |
| *H01L 27/1159* | (2017.01) |
| *H01L 29/423* | (2006.01) |
| *H01L 29/10* | (2006.01) |
| *H01L 29/06* | (2006.01) |
| *H01L 29/66* | (2006.01) |
| *H01L 29/78* | (2006.01) |
| *H01L 21/3105* | (2006.01) |

(Continued)

(52) U.S. Cl.
CPC ...... *H01L 27/1159* (2013.01); *H01L 29/0692* (2013.01); *H01L 29/1033* (2013.01); *H01L 29/42364* (2013.01); *H01L 29/42376* (2013.01); *H01L 29/6684* (2013.01); *H01L 29/78391* (2014.09); *G11C 11/161* (2013.01); *G11C 11/22* (2013.01); *G11C 11/221* (2013.01); *H01L 21/0273* (2013.01); *H01L 21/3065* (2013.01); *H01L 21/31053* (2013.01); *H01L 21/32136* (2013.01); *H01L 21/76224* (2013.01)

(58) Field of Classification Search
CPC .......... H01L 27/1159; H01L 29/78391; H01L 29/0692; H01L 29/1033; H01L 29/42364; H01L 29/42376; H01L 29/6684; H01L 21/0273; H01L 21/3065; H01L 21/31053; H01L 21/32136; H01L 21/76224
USPC ........................................................ 365/145
See application file for complete search history.

(56) References Cited

U.S. PATENT DOCUMENTS

| | | | |
|---|---|---|---|
| 6,013,950 A * | 1/2000 | Nasby | ............... H01L 27/11502 257/295 |
| 6,537,830 B1 * | 3/2003 | Arita | ................... C23C 16/4412 438/3 |

(Continued)

OTHER PUBLICATIONS

Ngoc et al. "Low-Programmable-Voltage Nonvolatile Memory Devices Based on Omega-shaped Gate Organic Ferroelectric P(VDF-TrFE) Field Effect Transistors Using p-type Silicon Nanowire Channels", Nano-Micro Letters, 2014, 7 pages.

(Continued)

*Primary Examiner* — Ly D Pham
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to rounded shaped transistors and methods of manufacture. The structure includes a gate structure composed of a metal electrode and a rounded ferroelectric material which overlaps an active area in a width direction into an isolation region.

20 Claims, 2 Drawing Sheets

(51) Int. Cl.

| | | |
|---|---|---|
| H01L 21/3213 | (2006.01) | |
| H01L 21/027 | (2006.01) | |
| H01L 21/762 | (2006.01) | |
| H01L 21/3065 | (2006.01) | |
| G11C 11/16 | (2006.01) | |

(56) References Cited

U.S. PATENT DOCUMENTS

| | | | |
|---|---|---|---|
| 9,875,784 B1* | 1/2018 | Li | G11C 11/2275 |
| 2015/0041873 A1* | 2/2015 | Karda | H01L 29/1037 |
| | | | 257/295 |
| 2015/0310905 A1* | 10/2015 | Karda | H01L 29/42368 |
| | | | 365/185.03 |
| 2016/0064228 A1* | 3/2016 | Van Bentum | H01L 21/28185 |
| | | | 257/295 |
| 2017/0162702 A1* | 6/2017 | Hu | H01L 29/78391 |
| 2017/0178712 A1* | 6/2017 | Van Houdt | G11C 11/223 |
| 2018/0166582 A1* | 6/2018 | Liao | H01L 29/78391 |
| 2018/0366476 A1* | 12/2018 | Liu | H01L 27/1159 |
| 2018/0366484 A1* | 12/2018 | Richter | H01L 29/4234 |
| 2019/0273087 A1* | 9/2019 | Morris | G11C 11/22 |

OTHER PUBLICATIONS

Khist et al., "Size Effects of Ferroelectric and Magnetoelectric Properties of Semi-ellipsoidal Bismuth Ferrite Nanoparticles", Journal of Alloys and Compounds, 2017, 1 page.

* cited by examiner

ROUNDED SHAPED TRANSISTORS FOR MEMORY DEVICES

FIELD OF THE INVENTION

The present disclosure relates to semiconductor structures and, more particularly, to rounded shaped transistors and methods of manufacture.

BACKGROUND

A ferroelectric field effect transistor (FeFET) can be used for memory devices. The FeFET typically uses a high-k dielectric material such as hafnium oxide in its gate structure, which allows the device to be scaled down, while integrating it with current CMOS processes. Advantageously, the FeFET can maintain its logic state even when power is removed.

Highly scaled non-volatile memory (NVM) FeFETs show strong area and geometry dependencies. Fringing fields from the internal depolarization field at the FeFETs gate corner, though, can cause significant variation of the electrical parameters.

SUMMARY

In an aspect of the disclosure, a structure comprises a gate structure composed of a metal electrode and a rounded ferroelectric material which overlaps an active area in a width direction into an isolation region.

In an aspect of the disclosure, a structure comprises: a ferroelectric field effect transistor composed of a gate electrode and a circular or elliptic shape of ferroelectric material, the circular or elliptic shape of ferroelectric material is over an active semiconductor region and overlaps into an adjacent isolation region.

In an aspect of the disclosure, a ferroelectric field effect transistor comprises a gate electrode and an elliptic shape of ferroelectric material, the elliptic shape of ferroelectric material includes a channel region with lengths L1 and L2, where L2≈L1, and is over an active semiconductor region and overlaps into an adjacent isolation region, and is approximately 45 degrees tilted against a channel-orientation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to rounded shaped transistors and methods of manufacture. More specifically, the present disclosure provides a circular or elliptic shape (generally referred to as rounded) ferroelectric field effect transistor (FeFET). Advantageously, the use of a circular or elliptic shape for a ferroelectric layer is optimum between edge-driven depolarization fields and volume-driven remnant polarization of the domains. For example, in embodiments, by implementing the shapes described herein, there is a minimum perimeter to area ratio for a given cell size and reduced variation and back-switching effects. The use of the shapes described herein also allows for more robust or denser non-volatile memory arrays.

In embodiments, the structures comprise a circular or elliptic (generally rounded) shape of ferroelectric material (which is not necessarily identical to shape of the metal electrode). The ferroelectric layer preferably overlaps an active area, in width direction, into an isolation region. In embodiments, the elliptic shaped layer can be at any desirable angle, preferably 45 degrees tilted against the channel-orientation. The active area under the ferroelectric layer can also be elliptic shaped. The array structure can be made of many elliptic structures (i.e., no continuous wordline in an AND architecture).

The transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the transistor of the present disclosure have been adopted from integrated circuit (IC) technology. For example, the structures are built on wafers and are realized in films of material patterned by photolithographic processes on the top of a wafer. In particular, the fabrication of the transistors use three basic building blocks: (i) deposition of thin films of material on a substrate, (ii) applying a patterned mask on top of the films by photolithographic imaging, and (iii) etching the films selectively to the mask.

Figure 1:
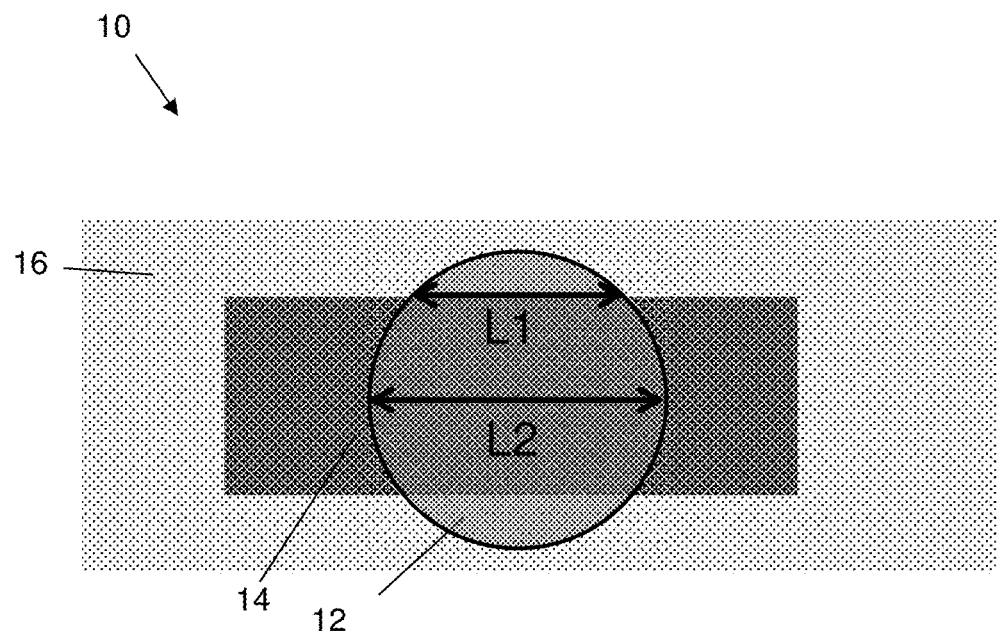
FIG. 1 shows a circular gate structure and respective fabrication processes in accordance with aspects of the present disclosure.

FIG. 1 shows a gate structure and respective fabrication processes in accordance with aspects of the present disclosure. More specifically, the structure 10 of FIG. 1 shows a rounded gate structure 12 formed over an active area 14 (e.g., channel region, source region and drain region) composed of semiconductor material. In embodiments, the rounded gate structure 12 is circular and can be a FeFET composed of a ferroelectric high-k material (e.g., hafnium oxide) and metal gate materials (metal gate electrode) known to those of skill in the art such that no further explanation is required. In embodiments, the ferroelectric material can be circular shape with a thickness of about 10 nm (e.g., cylindrical shape); whereas, the metal gate materials can be of the same or different shape. The ferroelectric material should have a polarization out of plane. The circular shape gate structure 12 enables, supports, and or assists a single domain and grain. As discussed further herein, the optimal FeFET layout has a circular gate area due to the optimum between perimeter and area.

Still referring to FIG. 1, the gate structure 12 includes a channel region having lengths L1 and L2, where L2>L1. The length L2 can be about 30 nm to 1000 nm, and more preferably about 200 nm. The gate structure 12 partially overlaps into an isolation region 16, adjacent to the active regions 14. For example, 10% to 20% of the gate structure 12 can overlap into the isolation region 16. In more specific embodiments, the overlap can be about 10 nm to about 20 nm into the isolation region. The active region 14 can be planar, composed of any suitable semiconductor material including, but not limited to, Si, SiGe, Ge, SiGeC, SiC, GaAs, InAs, InP, and other III/V or II/VI compound semiconductors. The active regions 14 can be formed by a doping or ion implantation process known to those of skill in the art such that no further explanation is required. The isolation region 16 can be an oxide material, e.g., $SiO_2$.

The gate structure 12 and shallow trench isolation structures 16 can be formed by conventional lithography, etching and deposition methods known to those of skill in the art. For example, the gate structures 12 can be formed by deposition of ferroelectric high-k material, metal gate materials and a capping material (e.g., nitride), followed by a patterning process. In embodiments, the patterning process includes a resist formed over the capping material (e.g., nitride) which is exposed to energy (light) to form a pattern (circular opening). An etching process with a selective chemistry, e.g., reactive ion etching (RIE), will be used to form the shape of the gate structure 12. The resist can then be removed by a conventional oxygen ashing process or other known stripants. Sidewall spacers can be formed on the sidewalls of the gate structure 12 using conventional nitride or oxide deposition processes followed by anisotropic etching processes.

The shallow trench isolation structures 16 can be fabricated by forming a resist over the semiconductor material and exposing it to energy (light) to form a pattern. An etching process with a selective chemistry, e.g., RIE, will be used to form one or more trenches into the semiconductor material, through the openings of the resist. The resist can then be removed by a conventional oxygen ashing process or other known stripants. Following the resist removal, an insulator material (oxide) can be deposited by any conventional deposition processes, e.g., chemical vapor deposition (CVD) processes. Any residual material on the surface of the semiconductor material can be removed by conventional chemical mechanical polishing (CMP) processes.

Figure 2:
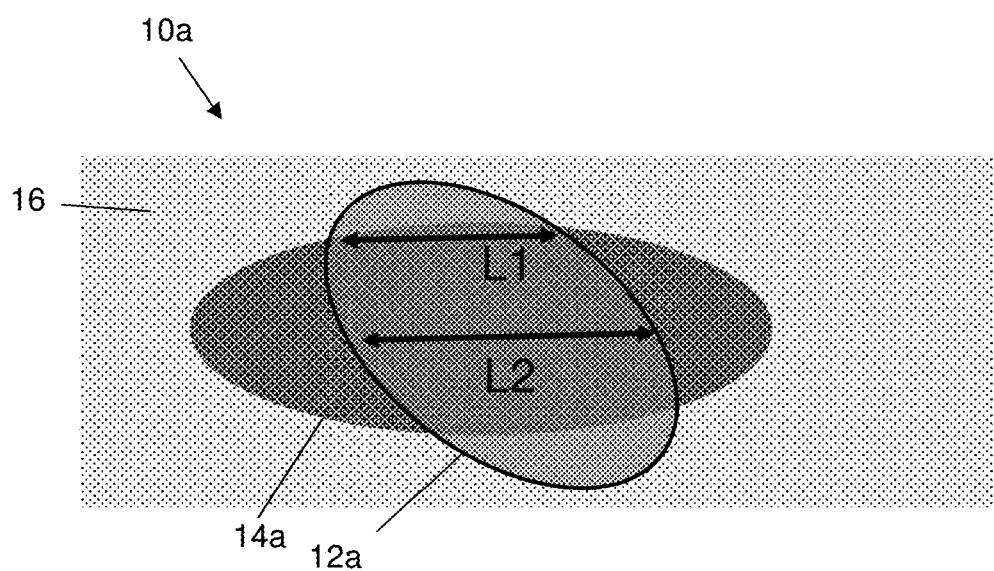
FIG. 2 shows an elliptic gate structure and respective fabrication processes in accordance with additional aspects of the present disclosure.

FIG. 2 shows a gate structure and respective fabrication processes in accordance with additional aspects of the present disclosure. More specifically, the structure 10a of FIG. 2 shows an elliptic gate structure 12a formed over an active region 14a (e.g., source region and drain region) composed of the semiconductor material. In this embodiment, the active region 14a can also be elliptic shape; although, it is contemplated that this active region 14a can be rectangular in shape as shown in FIG. 1. The elliptic formed layer of the gate structure 12a can be 45 degree tilted against the channel-orientation to reduce leakage. This orientation can also be at other angles; however, the 45 degree tilted angle against the channel-orientation is optimal for reducing leakage. In the 45 degree orientation, the gate structure 12a will have a channel region with lengths L1 and L2, where L1≈L2. The length L1 and L2 can be about 30 nm to 1000 nm; although other dimensions are also contemplated herein.

In embodiments, the gate structure 12a can be a FeFET composed of a ferroelectric high-k material and metal gate materials. In this embodiment, the ferroelectric material can be elliptic shape with a thickness of about 10 nm (although other dimensions are also contemplated herein); whereas, the metal gate materials can be the same or different shape. As with the embodiment shown in FIG. 1, the gate structure 12a partially overlaps into the isolation region 16, adjacent to the active area 14a. For example, 10% to 20% of the gate structure 12 can overlap onto the isolation region 16. In more specific embodiments, the overlap can be about 10 nm to about 20 nm.

Figure 3:
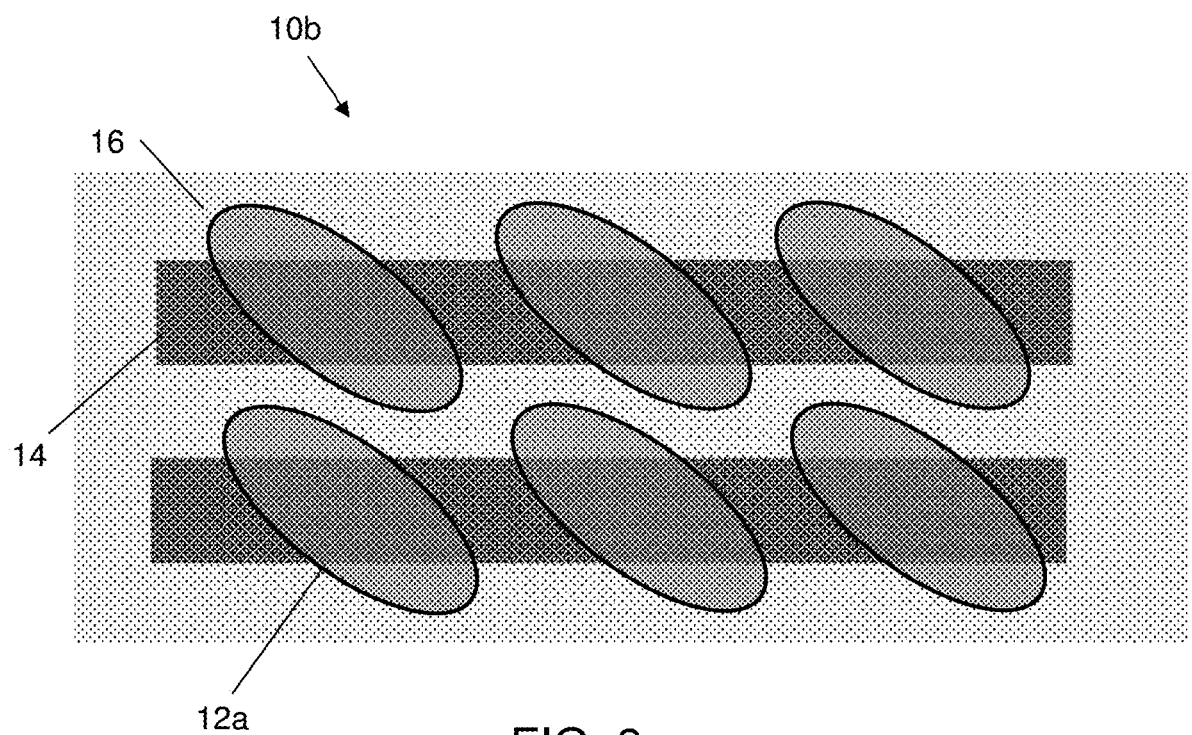
FIG. 3 shows an array of rounded (e.g., elliptic) gate structures in accordance with aspects of the present disclosure.

FIG. 3 shows an array of gate structures in accordance with aspects of the present disclosure. In this array 10b, the gate structures 12a are elliptic shape and each row has gate structures 12a which are offset from one another in the row above and/or below. The elliptic gate structures 12a are also angled at about 45 degrees. In this way, the array 10b can have the highest density of gate structures 12a. The active regions 14 can be composed of a single strip of semiconductor material for each row of gate structures 12a. It should be understood by those of ordinary skill in the art that the array 10b of FIG. 3 can equally be representative of circular gate structures.

Figure 4:
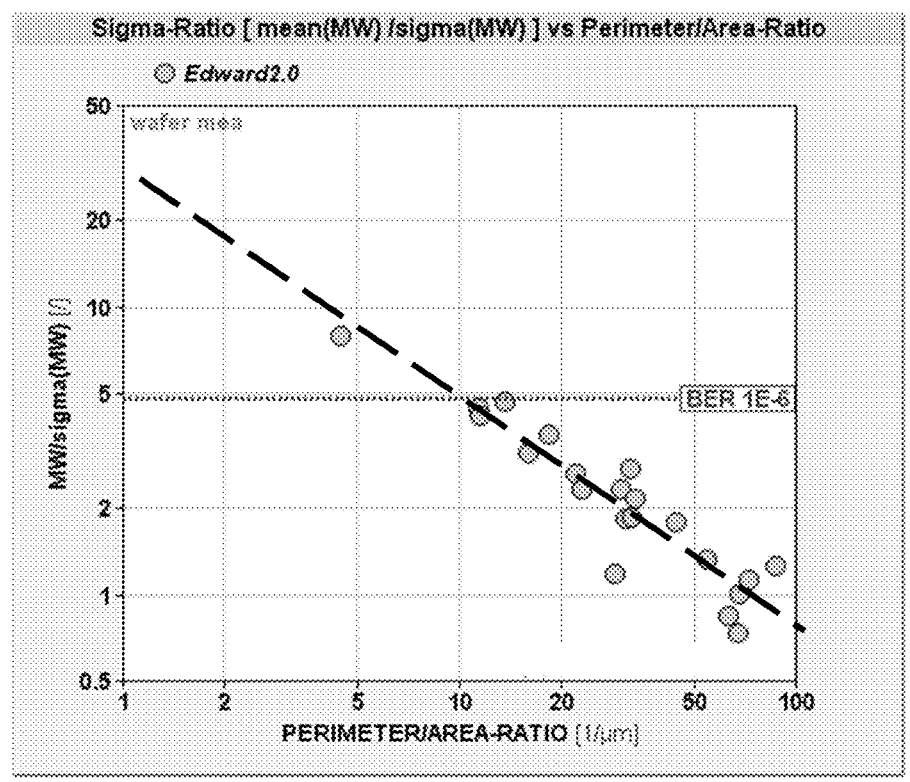
FIG. 4 shows a performance graph of FeFETs.

FIG. 4 shows a performance graph of FeFETs. In FIG. 4, the x-axis is perimeter/area ratio and the y-axis is memory window/sigma. It should be noted that a key figure of merit for FeFET cells is the Memory-Window (MW) divided by standard deviation (σ) (MW). This parameter shows a strong dependency from the shape and area of the ferroelectric layer, with a minimal perimeter and a large area providing the best performance. Accordingly, in accordance with the graph shown herein, a circular shape FeFET would provide an optimum performance. For example, a perimeter/area-ratio of a square is 4/x and a perimeter/area-ratio of a circle is $\sqrt{\pi}$r. At same area, the circle has a ratio of 3.54 vs. a square with a ratio of 4. That is, the circle has an ~12% smaller ratio resulting in an ~1 sigma improvement in MW/σ(MW).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a gate structure composed of a metal electrode and a rounded ferroelectric material which overlaps an active semiconductor region which is located under the gate structure and in a width direction into an isolation region adjacent to the active semiconductor region.

2. The structure of claim 1, wherein the rounded ferroelectric material is circular.

3. The structure of claim 2, wherein the metal electrode is circular.

4. The structure of claim 2, wherein the ferroelectric layer is a high-k dielectric material.

5. The structure of claim 2, wherein the ferroelectric material has a polarization out of plane.

6. The structure of claim 2, wherein a channel region of the gate structure includes lengths L1 and L2, where L2>L1.

7. The structure of claim 1, wherein the rounded ferroelectric material partially overlaps into the isolation region, adjacent to the active semiconductor region by about 10% to 20% of the gate structure.

8. The structure of claim 1, wherein the rounded ferroelectric material is elliptic.

9. The structure of claim 8, wherein the elliptic ferroelectric material is 45 degrees tilted against a channel-orientation.

10. The structure of claim 9, further comprising an array of gate structures which are composed of the elliptic ferroelectric material.

11. The structure of claim 10, wherein the array of the gate structures includes a plurality of rows, wherein the elliptic ferroelectric material in each row is offset from an adjacent row.

12. The structure of claim 8, wherein the active semiconductor region under the ferroelectric material has an elliptic shape.

13. A structure comprises a ferroelectric field effect transistor composed of a gate electrode and a circular or elliptic shape of ferroelectric material, the circular or elliptic shape of ferroelectric material being located under the gate electrode and over an active semiconductor region and an isolation region that it adjacent to the active semiconductor region.

14. The structure of claim 13, wherein a channel region of the gate structure includes lengths L1 and L2, where L2>L1.

15. The structure of claim 13, wherein a channel region of the gate structure includes lengths L1 and L2, where L2≈L1.

16. The structure of claim 15, wherein the active semiconductor region under the ferroelectric material has an elliptic shape.

17. The structure of claim 15, wherein the elliptic ferroelectric material is 45 degrees tilted against a channel-orientation.

18. The structure of claim 15, further comprising an array of gate structures which are composed of the elliptic ferroelectric material, wherein the array of the gate structures includes a plurality of rows, wherein the elliptic ferroelectric material in each row is offset from an adjacent row.

19. A ferroelectric field effect transistor comprising a gate electrode over an elliptic shape of ferroelectric material, the elliptic shape of ferroelectric material includes a channel region with lengths L1 and L2, where L2≈L1, and the elliptic shape of ferroelectric material is located over an active semiconductor region and overlaps into an isolation region adjacent to the active semiconductor region, and is approximately 45 degrees tilted against a channel-orientation.

20. The structure of claim 19, further comprising an array of ferroelectric field effect transistors which are composed of the elliptic ferroelectric material, wherein the array of the ferroelectric field effect transistor includes a plurality of rows, wherein the elliptic ferroelectric material in each row is offset from an adjacent row.

* * * * *